United States Patent [19]

Hall et al.

[11] Patent Number: 4,915,476

[45] Date of Patent: Apr. 10, 1990

[54] SINGLE-NOTCH RUGATE FILTERS AND A CONTROLLED METHOD OF MANUFACTURE THEREOF

[75] Inventors: James T. Hall, Torrance; Ronald T. Smith, Redondo Beach, both of Calif.

[73] Assignee: Hughes Aircraft Company, Los Angeles, Calif.

[21] Appl. No.: 200,807

[22] Filed: May 31, 1988

[51] Int. Cl.$^4$ .............................................. G02B 5/28
[52] U.S. Cl. .................................... 350/163; 350/320
[58] Field of Search ............................... 350/163, 320

[56] References Cited

U.S. PATENT DOCUMENTS

4,545,646 10/1985 Chern et al. ..................... 350/162.2
4,707,611 11/1987 Southwell ........................... 250/560

Primary Examiner—Bruce Y. Arnold
Attorney, Agent, or Firm—Mary E. Lachman; W. J. Streeter; W. K. Denson-Low

[57] ABSTRACT

A process for forming a single-notch optical filter having a continually and accurately varying periodic profile. An optical medium is coated on a uniform substrate where the homogeneous optical medium produces a rugate filter, so that the profile of the refractive index follows a sinusoidal pattern and Bragg's law. As the optical medium is coated on the substrate, the depositing film is monitored by optical techniques, and feedback information is provided to a computer driven by a pre-programmed process control algorithm so that real time control of the manufacturing process may be accomplished.

10 Claims, 11 Drawing Sheets

SINGLE-NOTCH RUGATE FILTERS AND A CONTROLLED METHOD OF MANUFACTURE THEREOF

This invention was made with United States Government support under Contract No. F33615-83-C-5012 awarded by the Department of the Air Force. The U.S. Government has certain rights in this invention.

BACKGROUND OF THE INVENTION

1. Field of the Invention

This invention relates generally to the field of optically reflective filters and materials, and, more particularly, to a single-notch rugate filter manufactured under a monitored and feedback-controlled deposition process.

2. Description of Related Art

An important criterion in the operation of optical sensors is protecting the sensors from possible damage caused by lasers. This protection is referred to as laser hardening and has become necessary due to the widespread use of lasers in industrial and military applications, such as ranging and communications.

Such protection is needed because laser radiation from friendly or hostile sources, even at lower energy levels, can disable or damage a detection system by saturating or burning out vulnerable components or detector elements. While protecting such systems, low spectral distortion and high see-through are needed to depict an accurate signal.

In conventional laser-hardening schemes, a standard method of such protection is a multi-layer dielectric reflective filter made of alternating layers of dissimilar materials. Among the problems associated with the use of such a discrete multi-layer structure is a residual stress caused by incompatible material properties at the abrupt interfaces. This stress, a problem common to discrete multi-layer coatings, can weaken the structure and lead to delamination of the layers. In addition, abrupt interfaces between dissimilar materials can be sites for dislocation and a high concentration of impurities. These sites can lower the protection capability and power tolerance of the filter if radiation is scattered into the detector or absorbed in the filter. Multi-layer filters also have inadequate broadband signal transmittance due to the undesired sideband reflectance peaks that arise from the interference effects inherent to the filter design limitations of alternating layer structures.

Simple reflective multi-layer dielectric filters typically consist of alternating layers of two dielectric materials of different refractive indices, which are formed on the surface of a substrate by known deposition techniques, such as chemical vapor deposition, sputtering, or thermal evaporation. The optical thickness (in this case, the product of the refractive index and layer thickness) of each layer is chosen to be one quarter of a wavelength of the radiation to be reflected, and such a structure is therefore referred to as a "quarter-wave stack". As previously noted, such multiple layer filters exhibit numerous problems, including the production, upon intense irradiation, of highly localized fields occurring at the abrupt interfaces between the layer surfaces which can produce temperature increases and can lead to structural failure.

In order to improve upon optical materials for use in optical filters, U.S. Pat. No. 4,545,646 to Chern et al (issued Oct. 8, 1985 and assigned to the present assignee) provided a graded-index optical material having continuous gradations in the stoichiometric composition and refractive index as a function of thickness of the material. The structure disclosed in U.S. Pat. No. 4,545,646 to Chern et al addressed many of the drawbacks, such as design and performance limitations, in multi-layer filters. Chern et al discloses a method whereby the substrate is exposed to first and second vapor phase reactants in predetermined proportions in the presence of radiation to induce a chemical reaction whereby the desired optical material is formed and deposited on the substrate. The optical material is deposited in accordance with a predetermined index of refraction. The proportion of the reactants to which the substrate is exposed is altered as a function of time in a predetermined and continuous manner which allows the predetermined and continuous variation of the stoichiometric composition and the index of refraction of the deposited material to produce a graded index of refraction. In this process of Chern et al it is assumed that the deposition process will occur according to the predetermined pattern. However, no method for insuring the accuracy of the deposition pattern was provided by Chern et al.

Thus, a need exists in the field of optical filters for a method for forming graded index optical structures in a controllable and accurate manner.

SUMMARY OF THE INVENTION

The present invention provides an error-compensation method for insuring attainment of a thin-film single-notch optical filter deposited on a uniform substrate and having desired properties. The thin-film, optically interactive medium has an algorithm-controlled, error-compensated, continuously varying refractive index profile perpendicular to the plane of the substrate. The varying refractive index profile of the medium is predominantly reflective at a single-notch or single band in wavelength. The refractive index profile is ideally or nearly sinusoidal with thickness position, thereby defining a "single-notch rugate filter". A sinusoidal variation of the deposition process conditions with time can produce such a film with a sinusoidally varying composition. In one embodiment of the present invention, the optically interactive medium may comprise an epitaxially grown film of aluminum-gallium-arsenide.

The optical filter medium of this invention is characterized by a varying refractive index profile that is error-compensated according to an algorithmic method of optical coating monitoring, wherein the medium is sinusoidally phase adjusted during deposition to follow a predetermined and optically measurable pattern. For this purpose, the use of the algorithm is novel, and the optical monitoring can be performed with standard, conventional means. The optically interactive medium coated upon a uniform substrate, that together with the substrate comprises the rugate filter of this invention, is transmissive to optical radiation except near or at a particular notch wavelength wherein the filter is predominantly reflective, and is referred to herein as "a single-notch rugate filter". A salient aspect of this single-notch rugate filter method is to form this optical medium layer so that the product of the average index of refraction and the sinusoidal period thickness is maintained in such a manner that the desired Bragg reflective condition is achieved accurately. This result is achieved through compensation of errors based on algorithmic actions according to optical monitoring signals during filter deposition. The algorithm directs the deposition process to make minor adjustments, either vertically or horizontally, to the depositing index profile in such a manner that the sinusoidal rugate profile that is theoretically desirable is accurately followed in an error-compensated manner. The resulting deposited index profile therefore results in theoretically desirable single-notch rugate filter properties. The present algorithmic method of deposition which forms a single-notch filter medium that is coated onto a uniform substrate includes the steps of:

(a) providing said substrate;

(b) providing reactants which interact physically or chemically to form said optical material as a layer on said substrate;

(c) providing an ideal target profile of refractive index versus thickness of said layer, said profile having a sinusoidal pattern, and determining from said profile ideal values of optical thickness at successive points in time corresponding to points along said profile;

(d) providing target process conditions as a function of time for said reactants operative to form said layer having said ideal target profile;

(e) initiating said process conditions to form a layer having a depositing profile;

(f) performing continuous optical monitoring of said layer as deposited to provide an optical signal;

(g) determining from said optical signal the measured increments of optical thickness of said layer as deposited and continuously monitoring said increments of optical thickness;

(h) determining whether said optical thickness value is measured at the predetermined time relative to said target process conditions that produce said ideal target profile;

(i) based on the results of (h), determining the sinusoidal phase angle adjustment required to be made to the depositing profile of refractive index versus thickness of said layer in order to follow accurately said ideal target profile;

(j) altering said process conditions over time to provide said sinusoidal phase angle adjustment to said actual profile;

(k) repeating steps "f" through "j" the number of times required to form said single notch rugate filter.

As the single-notch filter medium is being deposited to create the rugate filter, an optical monitoring light beam is directed at the medium so that the light beam is reflected off or transmitted through the medium at a perpendicular or known angle of incidence to an optical thickness detector system, which can be a conventional design similar to that used in monitoring quarter-wave stack depositions. This detector system generates output signals which are a function of the light beam intensity directed into the detector. The output signals are then fed back to the computerized deposition controller in order to adjust the sinusoidal phase commands of the deposition. In particular, to compensate for any systematic and random errors which may have occurred in the actual (depositing) profile, the target refractive index profile (with respect to growth thickness) is commanded to be adjusted with minor corrective structures that are either horizontal or vertical with respect to whether a target optical thickness is expectedly overdue or prematurely measured. The notch filter medium produced according to the error compensation method of this invention results in a periodically modulated refractive index profile such that the desired filter is accurately achieved since the notch wavelength is the product of twice the modulation period thickness and the periodically averaged refractive index, according to Bragg's law. The relative accuracy of the optical thickness detector system insures the accuracy of the desired Bragg reflective structure if corrective actions are made often enough (typically four times per modulation period for the most severe errors).

BRIEF DESCRIPTION OF THE DRAWINGS

FIG. 2b shows a graphic representation of reflectance versus wavelength of the refractive index profiles given in FIG. 2a.

FIG. 3a shows a graphic representation of the effects of optical monitoring and algorithmic error compensations according to the present invention on the index profile subjected to the same process errors as in FIG. 2a.

FIG. 3b shows a graphic representation of reflectance versus wavelength of the final refractive index profile given in FIG. 3a, relative to an ideal spectrum.

FIG. 4a shows a graphic representation of the poor reproducibility and inaccuracy of transmittance-versus-wavelength spectra from six simulations of profiles generated with random and systematic errors.

FIG. 4b shows a graphic representation of the effects of optical monitoring and algorithmic control according to the present invention for the improved reproducibility and accuracy of transmittance-versus-wavelength spectra from six profiles subjected to the same errors of FIG. 4a.

FIG. 6b shows a schematic graphic representation of the effects of monitoring at one-half the notch wavelength, the resulting optical thickness signals, and the relative algorithmic actions, according to the present invention, on the refractive index profiles subjected to the same illustrative fixed systematic deposition rate errors but now with twice as many corrective actions as in FIG. 6a.

DETAILED DESCRIPTION OF THE PREFERRED EMBODIMENT

Figure 1:
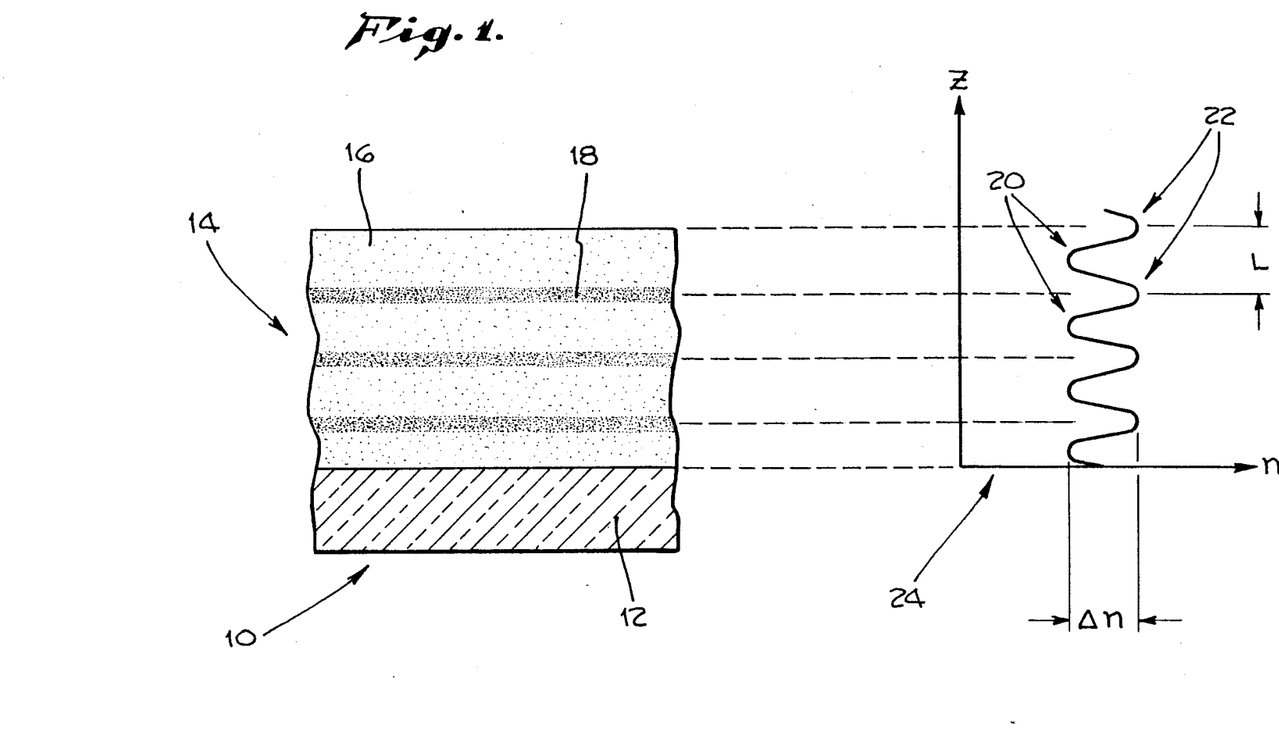
FIG. 1 shows an ideal schematic sinusoidal rugate profile versus film growth of the optically active medium coated on a substrate.

FIG. 1 shows a cross-sectional view of an ideal, sinusoidal rugate filter profile taken along the film thickness direction z. The rugate filter 10 is comprised of a compositionally uniform optically transmissive substrate material 12, upon which a graded-index, optical medium 14 is coated. The medium 14 exhibits a continuously varying graded index as depicted by the alternating and continuous optical index profile regions 16 and 18. Regions 16 and 18, respectively, emulate gradation of index troughs 20 and peaks 22 which are associated with a periodic, sinusoidal design as shown at graph 24, which plots refractive index (n) against film thickness in the z direction. The sinusoidal index profile in film thickness space (the z axis) is a spectrally pure form of periodic structure that will produce a predominant Bragg reflection at a single, narrow wavelength band. As used herein, the term "Bragg Reflection" refers to the fact that a periodic structure of the rugate filter follows Bragg's Law, originally applied to x-ray diffraction, which predicts that there will be a reflectance maximum in wavelength at the "notch wavelength," which is defined as follows:

$$\lambda_0 = 2\bar{n} L \cos\theta \qquad \text{Equation (1)}$$

where $\lambda_o$ equals the notch wavelength;
$\bar{n}$ equals the average index of refraction over one period in film thickness space;
L equals the physical length of periodicity or one cycle in film thickness space along the z axis within the medium 14; and
$\theta$ equals the angle of incidence of radiation, as measured from the perpendicular to the surface.

A discussion of Bragg's Law may be found, for example, in the book by D. Halliday and R. Resnick, entitled "Physics," Parts I and II, 1966, at page 1140 et seq. and in the publication by P. Yeh, A. Yariv, and C.-S. Hong, J. Opt. Soc. Am., Vol. 67, 1977, at page 423 et seq., both of which are incorporated herein by reference.

Unlike a quarter-wave stack which may be made from many layers of two alternating homogeneous films, the medium 14 of the rugate filter 10 of this invention is continuously varying and can be deposited with continuously varying process conditions on the substrate 12, thus varying the composition of the filter medium material in a continuous manner and continuously varying the refractive index locally, at the surface of deposition, as it is produced. Instead of a stack of two alternating homogenous films, as in known structures, a proper blend of the two materials during filter deposition can produce a sinusoidal index profile, which comprises a "single-notch rugate filter" in accordance with the present invention. The process conditions for the proper blend can be predetermined through prior calibration experiments that characterize deposition rates and mixing of constituent optical materials.

Figure 7:
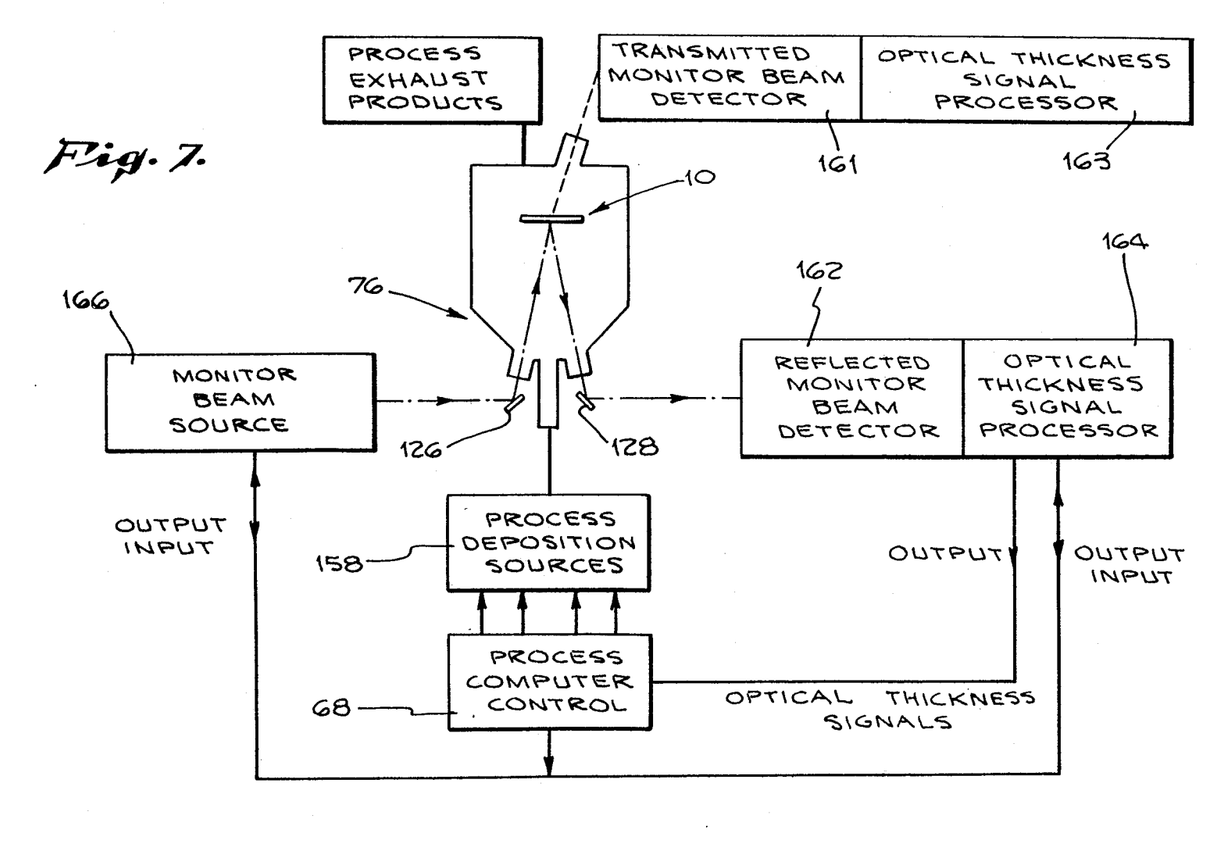
FIG. 7 shows a block diagram of a deposition processing system for producing the rugate filter of the present invention.

In one preferred embodiment of the present invention, metal-organic chemical vapor deposition (MOCVD) is used to produce an optical coating in the form of single crystal $Al_xGa_{1-x}As$, aluminum gallium arsenide. The aluminum and gallium fractions of the epitaxial layer are modulated (AlAs and GaAs materials are periodically counterblended) to produce a refractive index profile of a rugate filter which can be generated with refractive index control between about 2.9 and 3.3 since the refractive index varies with the fraction x where $0 \leq x \leq 1$ as:

$$n(x) \approx 3.3 - 0.4x, \qquad \text{Equation (2)}$$

for $Al_xGa_{1-x}As$ and near $\lambda = 4$ microns
Further details of this embodiment of the present invention are provided below in the discussion of FIG. 7. However, the present invention is not limited to a metal-organic chemical vapor deposition, but rather can be applied to any method for forming an optical material in which two or more reactants interact physically or chemically to deposit a layer of the optical material. Such other methods include, but are not limited to, other thermal chemical vapor deposition besides metal-organic chemical vapor deposition, photochemical vapor deposition, thermal evaporation or physical vapor deposition, electron beam evaporation, sputter deposition, and molecular beam epitaxial growth.

Figure 2A:
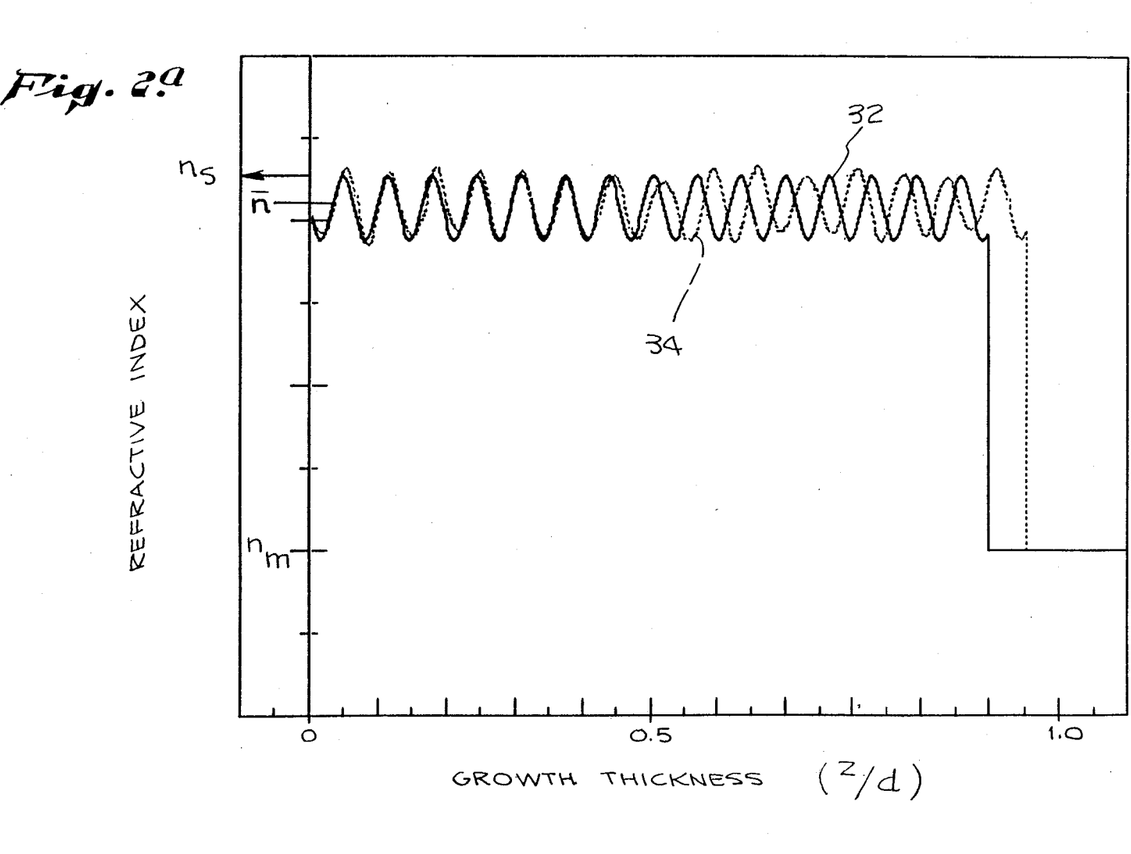
FIG. 2a shows a graphic representation of the refractive index profile versus growth thickness and compares a simulated index profile subjected to random and systematic process errors relative to an ideal, error-free profile.
Figure 2B:
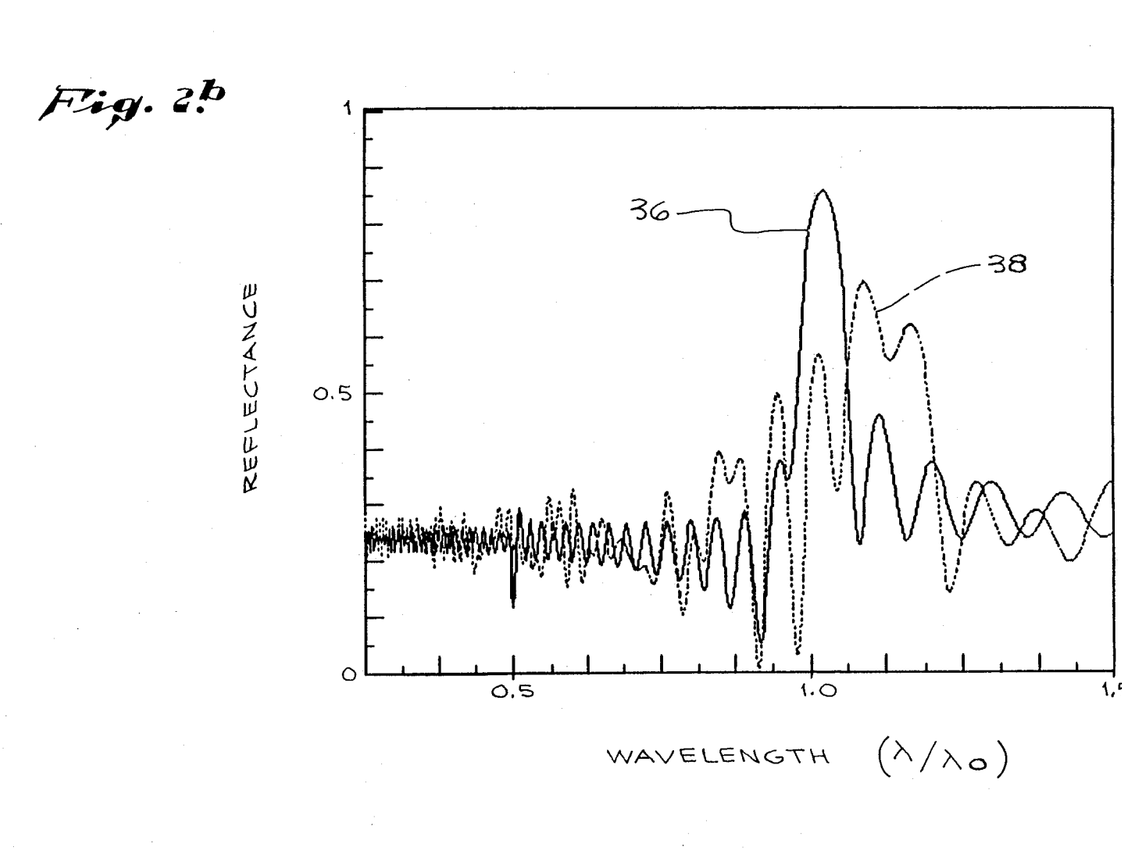

FIG. 2a (solid line 32) shows an ideal single notch rugate filter index profile versus growth thickness in a graphic representation where the refractive index is shown to vary in a sinusoidal manner producing a filter medium with just over 15 periods (10 microns of targeted film thickness in the case of $Al_xGa_{1-x}As$ for a notch at 4 microns in wavelength). The graded, sinusoidal target profile of the filter medium is shown with ideal periodicity at 32 of FIG. 2a, where $$n(z) = n - \frac{\Delta n}{2} \sin\left(\frac{4\pi n z}{\lambda_o}\right) \qquad \text{Equation (3)}$$

is the target design; and, where d is the final thickness; $n_m$ is the surrounding medium index (typically air), $n_s$ is the substrate index, and $\bar{n}$ is the average index of refraction over one period in film thickness space. Random and systematic errors, projected by computer simulation for this system, are shown by the dotted line 34. A time dependent systematic error is responsible for this profile which contains errors (i.e. error profile) ending up too thick, and random errors are responsible for small localized deviations. FIG. 2b shows the ideal error-free (solid line) 36 and error-containing (dotted line) 38 reflectance-versus-wavelength spectra (scaled to the notch wavelength $\lambda_o$) of the index profiles of FIG. 2a. Note that the notch region is greatly distorted in the spectrum of the error profile and that these errors are uncompensated by the algorithm of the present invention.

For illustrative purposes, although somewhat exaggerated for typical blind process control results, the error profile 34 of FIG. 2a contains random errors that statistically occur 30 times per period or about 460 times for the whole profile. These random errors can be characterized by about a 10% standard deviation in the optical thickness of each of the 460 deposition increments. In addition, there is a time-dependent, arbitrarily chosen, monotonically (smoothly) increasing, systematic error. This systematic error causes the optical thickness (i.e. the integral of the index profile over the film thickness space) of the whole profile to finish about 10% too large.

Such an ideal rugate filter profile as shown in FIG. 2a at 32 may be achieved by properly varying deposition parameters. In the case of the metal-organic process, parameters include concentrations of precursors such as trimethyl gallium and trimethyl aluminum in a background of arsine and hydrogen, as described hereinbelow. Thus, by using predetermined calibrations, it is possible to control the refractive index profile of the rugate filter.

In accordance with the present invention, a single-notch rugate deposition method is provided which may be controlled by an algorithm such that a rugate filter medium may be coated on the substrate according to the dictates of a predetermined error correction mechanism which relies on the relationships in Bragg's Law and optical thickness signal monitoring. This method thus achieves a periodically accurate, sinusoidal index modulation that is sufficient to produce the desired single-notch rugate filter properties. A rugate profile is designed according to the present method with a predetermined error correction mechanism which includes optically monitoring the medium 14 of FIG. 1 as it is being deposited on the substrate 12. As an example of the algorithm process, as shown in FIG. 3a, an optical monitoring signal (in this case a single-wavelength reflectance at normal incidence with a monitor wavelength at one-half of the notch wavelength) has been superimposed (dotted line 200) on the refractive index profile (solid line 202) subjected to the same errors as in FIG. 2a, but now compensated through corrective actions. Random and systematic errors have been taken into account by the algorithm (shown in detail in FIG. 5 and illustrated in FIG. 6) which is useful in establishing a finely tuned single-notch rugate filter, as shown by the reflectance spectrum in FIG. 3b. FIG. 3b shows the ideal (solid line 204) and error-compensated (dotted line 206) reflectance-versus-wavelength spectra. Note the improvement of the error-compensated spectrum 206 of FIG. 3b over the error spectrum 38 of FIG. 2b with the use of the algorithm of the present invention.

Figure 6A:
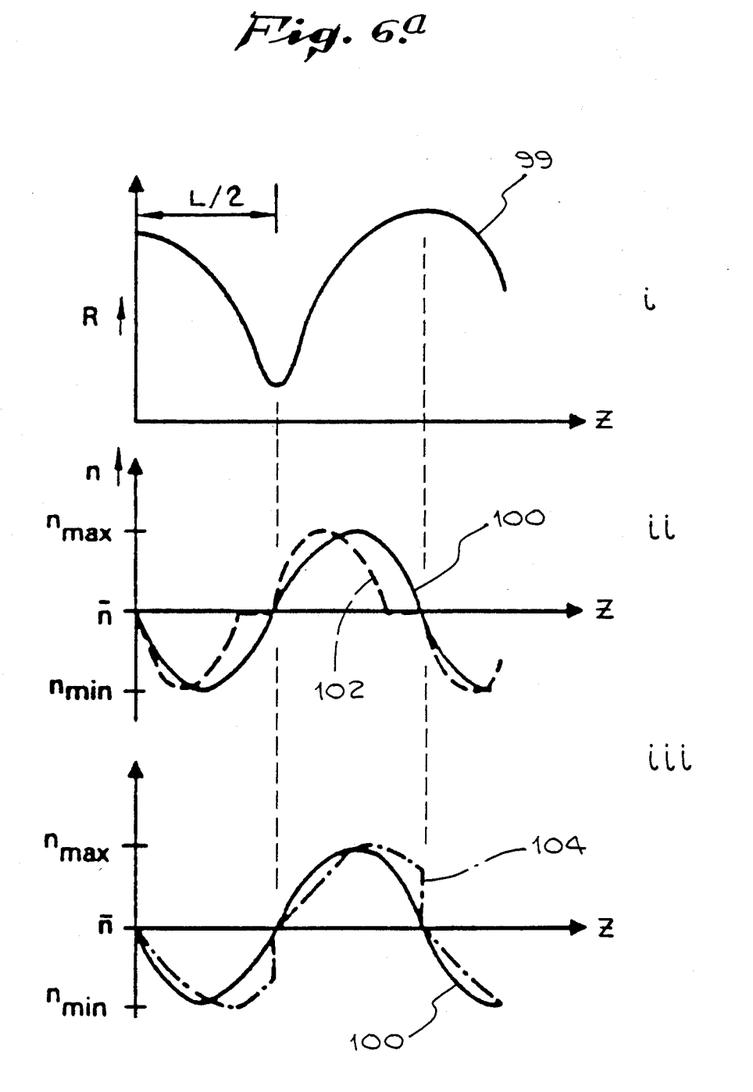
FIG. 6a shows a schematic graphic representation of the effects of monitoring at the notch wavelength, the resulting optical thickness signals, and the related algorithmic actions, according to the present invention, on refractive index profiles (as a function of film thickness) subjected to illustrative fixed systematic deposition rate errors.
Figure 6B:
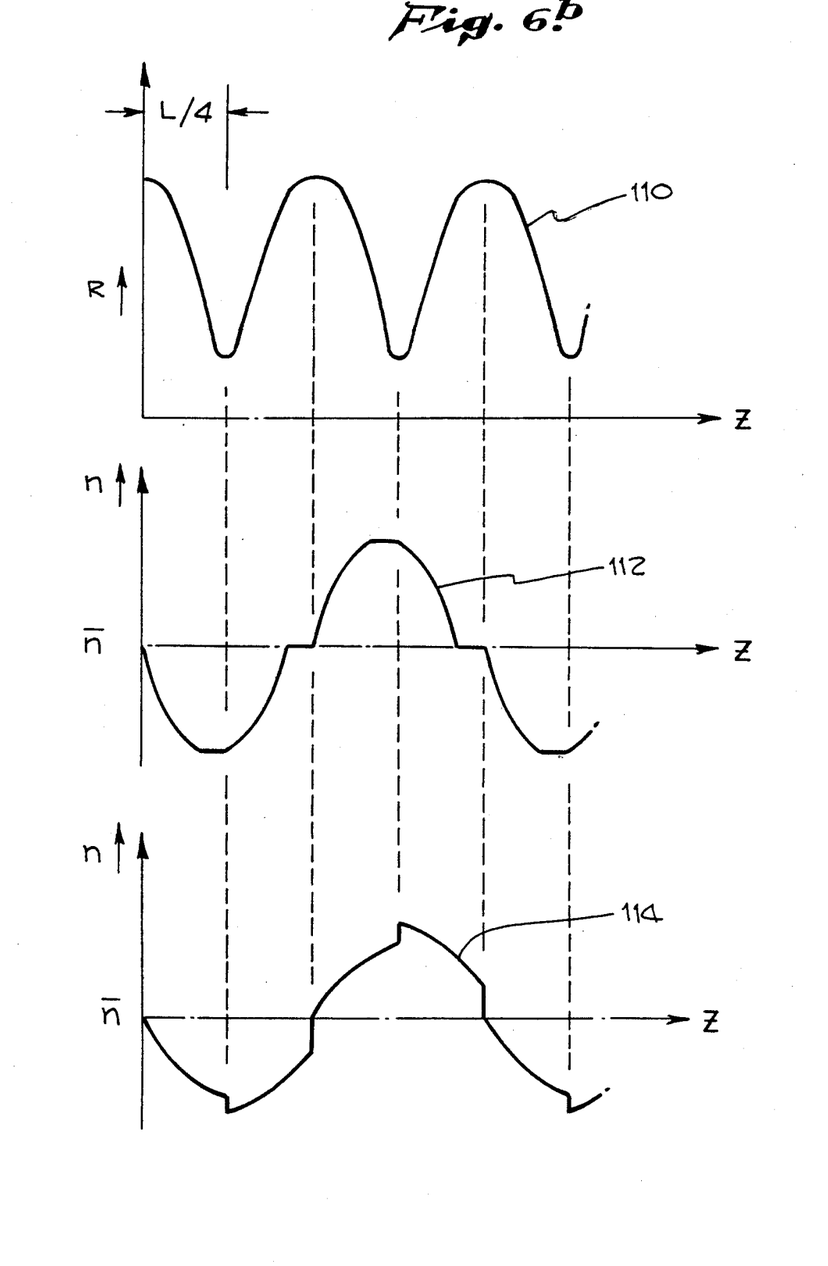

In accordance with this invention, a single-notch rugate filter is deposited on a uniform substrate according to an algorithm which represents the following considerations in order that the deposition be undertaken in a reliable and controlled fashion. As the deposition occurs in real time, the medium 14 of FIG. 1 is continuously optically monitored to assure that the sinusoidally developing medium profile has measured optical thickness increments that match accurately enough the ideal target optical thickness increments; adjustments are made to the on-going process according to pre-programmed alternative sequences (the algorithm) where the optical thickness signals accurately guide a sinusoidal deposition of the optical medium 14. If (1) an optical thickness signal has been actually measured, then the deposition conditions jump and/or continue according to where the process conditions should be for this signal rather than where any error may have taken them, or and if (2) an optical thickness signal is overdue relative to the current process conditions, then the process conditions hold in anticipation of the target optical thickness signal. Consequentially, the subject invention provides for both horizontal and vertical index profile corrective actions. (The terms "horizontal" and "vertical" refer to two perpendicular directions in the index versus thickness plane, as shown in FIGS. 6a and 6b and discussed in further detail below.) Accurate, incremental optical thickness signals can be easily measured by standard and conventional means since interference minima and maxima occur at every quarter-wave increment of optical thickness relative to a reflected or transmitted monitoring wavelength, as depicted in FIG. 3a (dotted line 200) for reflectance. Monitoring for the maxima and minima are referred to in the art as the "turning value method."

Figure 4B:
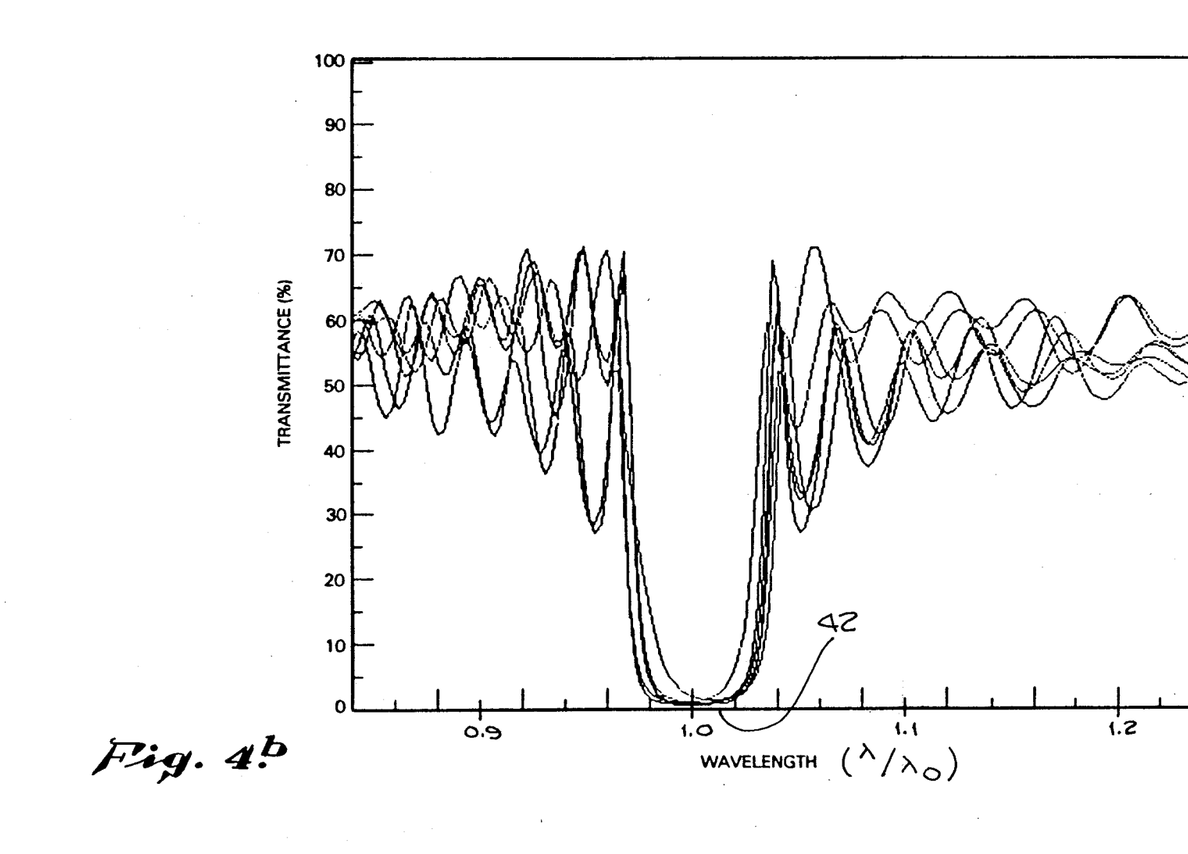

FIG. 4a shows the effects of uncompensated random and systematic errors and the reproducibility problems which may arise in the filter properties from blind process control. In contrast, FIG. 4b shows the resulting enhanced reproducibility and filter properties which result from using the control algorithm method for compensation of the same deposition errors in FIG. 4a, according to the present invention. For illustrative purposes, although somewhat exaggerated for actual blind process reproducibility, the six error profiles that resulted in the six filter properties portrayed in FIG. 4a each contain random errors that statistically occur twice per period or 64 times for the whole profile These random errors can be characterized by about a 7% standard deviation in the optical thickness of each of the 64 deposition increments. In addition, there is a time-independent, fixed systematic error in each error profile. This systematic error causes the optical thickness of the whole profile to end up about 4% too high. Consequently, in FIG. 4a, the average maximum reflectance is shown at 40 to be at a wavelength that is approximately four percent higher than the commanded target $\lambda_o$. FIG. 4a thus shows the effect of specified systematic and random errors when the optical medium deposition process proceeds blindly without optical monitoring and feedback control as envisioned by the present invention. In contrast, FIG. 4b shows the same type of plot where the average maximum reflectance has improved at 42 to a wavelength that is within approximately 0.5 percent of the target.

Figure 5:
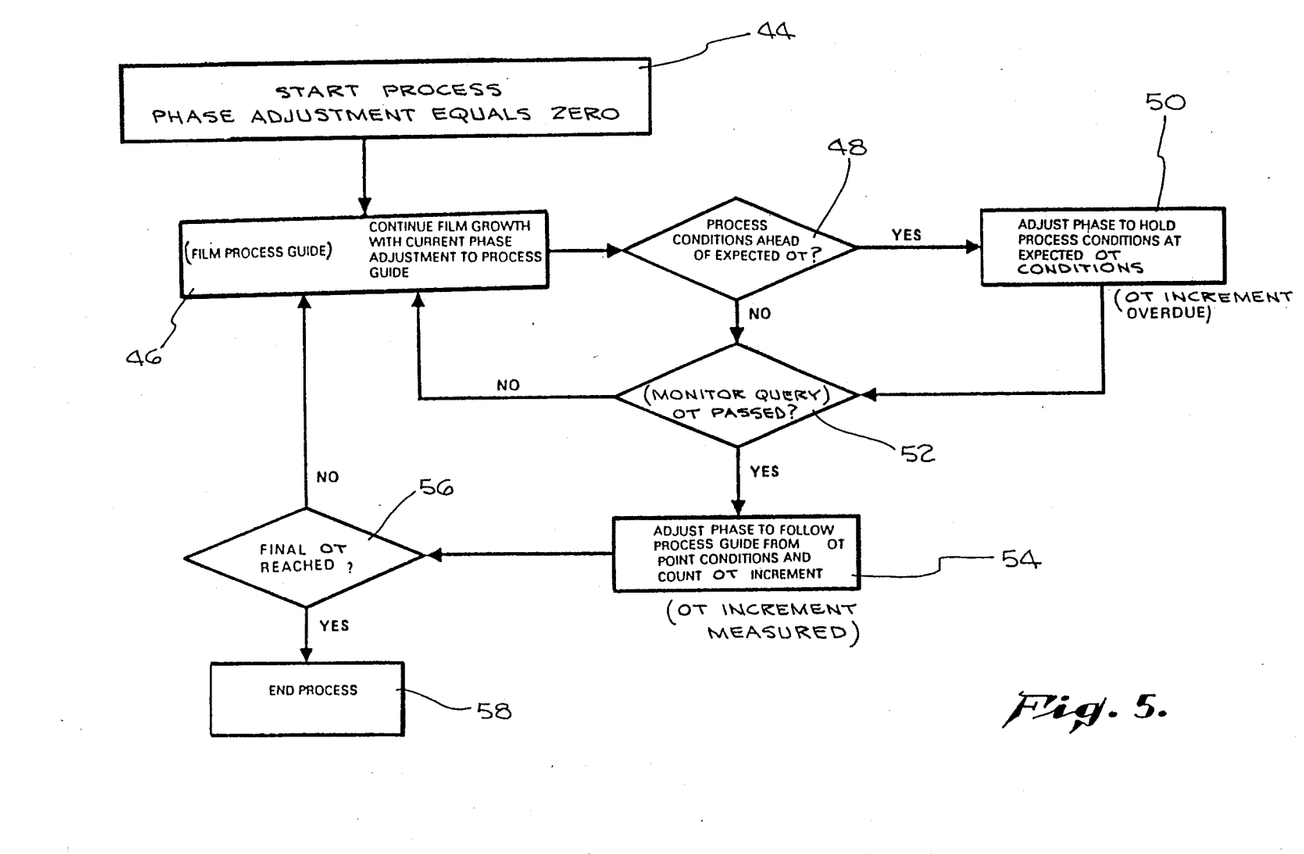
FIG. 5 is a flow diagram of the process sinusoidal-phase control algorithm of the present invention.

FIG. 5 shows a flow diagram of the process phase control algorithm of the present invention. An ideal profile of refractive index versus layer thickness is predetermined as a target profile. This ideal profile has a sinusoidal pattern, and predetermined values of optical thickness which can be determined for successive points in time corresponding to points on the ideal target profile. Based on known process parameters, target process conditions as a function of time are predetermined which will be effective for forming a layer of optical material guided by the ideal target profile. These process conditions are determined by a series of calibration trials in which variables affecting the chosen process are changed and the effect on the deposited layer determined. Such variables for a chemical deposition process include, but are not limited to, ratios of reactants, concentrations of reactions, flow rate of each reactant, total gas flow rate, pressure, temperature of reactants, temperature of substrate, and rate of deposition. (The term "reactant" as used herein is intended to include materials which interact physically, as well as materials which interact chemically.) The process commands for the ideal target profile are then shifted, if necessary for error compensation, during deposition with continual or continuous sinusoidal phase adjustments (controlled by the algorithm) relative to the current process conditions and the optical thickness status. The profile guided by the algorithm can be represented as:

$$n(z) = n^* - \frac{\Delta n^*}{2} \sin\left(\frac{4\pi n^* z^*}{\lambda_o} + \phi\right) \quad \text{Equation(4)}$$

where the starred parameters may have local errors relative to the error-free ideal profile, and $\phi$ is a phase angle adjustment that is inserted by the algorithm to compensate for any such errors relative to measured optical thicknesses. $\phi$ is referred to herein as "sinusoidal phase angle adjustment".

The process is started at box 44. The deposition of the optical medium 14 of FIG. 1 is allowed to start onto substrate 12 according to a continuous real time control with initial phase adjustment to the process set to zero (process conditions status initially on schedule). The process conditions are then guided through Equation (4) above in box 46 (film process guide). Inquiry is then made as to whether the current process conditions of deposition of the medium 14 onto the substrate 12 is ahead of the expected optical thickness signal (OT) in box 48. Since the process conditions are initially on schedule at the start 44, flow in the algorithm progresses at least initially to box 52 and then back to 46 since no OT signal will be expected or measured initially. While the process remains (or is assumed to remain) on schedule and no OT is measured ahead of schedule, the algorithm will continue in the loop 46-48-52-46.

If the process conditions are ahead of schedule (i.e., a predetermined and expected optical thickness has not been measured yet), then the process parameters are commanded to hold at the expected optical thickness process conditions 50. This "holding" adjustment occurs where the currently depositing film index is too low, or the deposition rate is too small, or the current optical thickness of the profile is too small, and therefore the currently commanded process conditions are ahead of schedule relative to the actually measured optical thickness. Subsequent to this adjustment, optical monitoring 52 is conducted. Until the expected optical thickness is actually measured, the algorithm continues in the loop 46-48-50-52-46, which produces commands for continuously changing $\phi$ for a horizontal profile command segment. At Diamond 52 optical monitoring is conducted by reflecting a monitor beam of light off the sample or transmitting a monitor beam of light through the sample, typically at perpendicular angle of incidence or near perpendicular angle of incidence to provide an optical signal, and determining from this optical signal actual optical thicknesses. Typically and conventionally, optical thickness signals are easily provided by intensity minima or maxima in the thusly directed monitor beam of a single wavelength, and these intensity extrema correspond to quarter-waves of optical thickness relative to the monitor beam wavelength. This is referred to in the art as the "turning value" method. When the predetermined optical thickness is finally measured, the algorithm passes the process to box 54 where the phase is fixed at the process conditions for this predetermined optical thickness. In this case the loop 46-48-50-52 is terminated into box 54 where the last value for $\phi$ acquired in box 50 is used. After box 54, inquiry is made as to whether the final optical thickness has been reached in box 56. If it has, the process is ended in box 58. If it has not, the film growth process continues with the same phase, at least momentarily, in loop 46-48-52-46 until an affirmative decision in box 48 or 52 is reached.

Passing through box 54 can alternatively occur without first passing through the 46-48-50-52 sequence. This can happen when the process conditions are exactly on schedule with no phase change necessary.

Alternatively, if the process conditions are behind schedule (i.e., a predetermined optical thickness is prematurely measured), then just one abrupt phase adjustment is commanded to bring the process conditions to the point of this known optical thickness. This adjustment can occur when the current deposition rate is too fast or the currently depositing film index is too high, or the current optical thickness of the profile is too large, and therefore the currently commanded process conditions are behind schedule relative to the measured optical thickness. In either of these cases, loop 46-48-52-46 is temporarily interrupted, and there will be one pass through the loop 46-48-52-54-56-46 unless the final optical thickness increment is measured, in which event the process ends through box 56 into box 58.

With reference to FIG. 6a, illustrative examples are shown for depositing sinusoidal rugates with deposition rate errors that are fixed systematically too slow (FIG. 6a-ii) or too rapid (FIG. 6a-iii). The object of the algorithm in FIG. 5 is to accurately maintain the product of the actual average index of refraction ($\bar{n}$) and the actual period thickness (L) so that the Bragg condition, indicated in Equation (1) above, is maintained in a periodically modulated fashion. The process control algorithm of FIG. 5 reads incremental optical thickness signals (graphically shown as vertical dotted-lines, with L/2 increments at the top of FIG. 6a-i as 99) and governs the manner in which the error corrections of FIGS. 6a-ii and 6a-iii are accomplished through proper process commands. The film thickness increments, L/2, correspond in this case to the incremental optical thickness signals. FIG. 6a-i schematically shows the optical monitoring signals as measured on a graph of reflectance (R) against film growth thickness (Z), using a monitor beam at the notch wavelength. Convenient signals occur at minima and maxima which correspond via the turning-value method to quarter-wave optical thickness increments relative to the monitor wavelength, which in this case is the notch wavelength. FIG. 6a-ii shows a graphic representation (dashed line 102) of the index of refraction that is commanded against film growth thickness for a deposition that has a systematic rate error that is fixed too slow. Similarly, such a graph is shown (dash-dotted line 104) at FIG. 6a-iii for a deposition that has a systematic rate error that is fixed too fast. Plotted solid line curves 100 in FIGS. 6a-ii and 6a-iii show the refractive index profile where the film growth occurs ideally on target. Horizonal profile segment corrections are made by the algorithm in 102 of FIG. 6a-ii to better meet the desired Bragg condition for each period of film growth. Similarly, FIG. 6a-iii shows where vertical profile jump corrections are made in curve 104 to meet the desired Bragg condition. The horizontal profile segments in FIG. 6a-ii correspond with algorithm commands at Box 50 of FIG. 5 where the optical monitoring signal is overdue relative to the current commands of the process conditions, because the current optical thickness rate of deposition is proceeding too slowly, behind schedule. Alternatively, the vertical profile jumps in 104 of FIG. 6a-iii show the algorithm commands of Box 54 of FIG. 5 where the current optical thickness rate of deposition is proceeding too fast relative to the current commands of the process conditions, so that optical thickness increments are reached too rapidly, ahead of schedule.

In this manner, an optimum profile for the optical medium 14 coated upon the substrate 12 may be achieved which provides a rugate filter profile having a particular notch wavelength where optical radiation is reflected, according to Bragg's law, at the desired notch wavelength.

An alternative deposition profile is shown at FIG. 6b, using optical thickness signals from a monitor beam tuned to one-half the notch wavelength. Curve 110 has L/4 film thickness increments corresponding to quarter-wave optical thickness signals relative to one-half the notch wavelength and therefore has twice as many corrective opportunities per period compared with monitoring at the notch wavelength in FIG. 6a. When the deposition rate is too slow or too rapid, the average index is adjusted by the algorithm of FIG. 5 according to curves 112 and 114. Curve 112 has horizontal profile correction commands to the deposition process, while curve 114 has vertical correction commands. The vertical and horizontal process commands in FIG. 6b as in FIG. 6a are respectively given by algorithmic commands in boxes 50 and 54 in FIG. 5.

Figure 3:
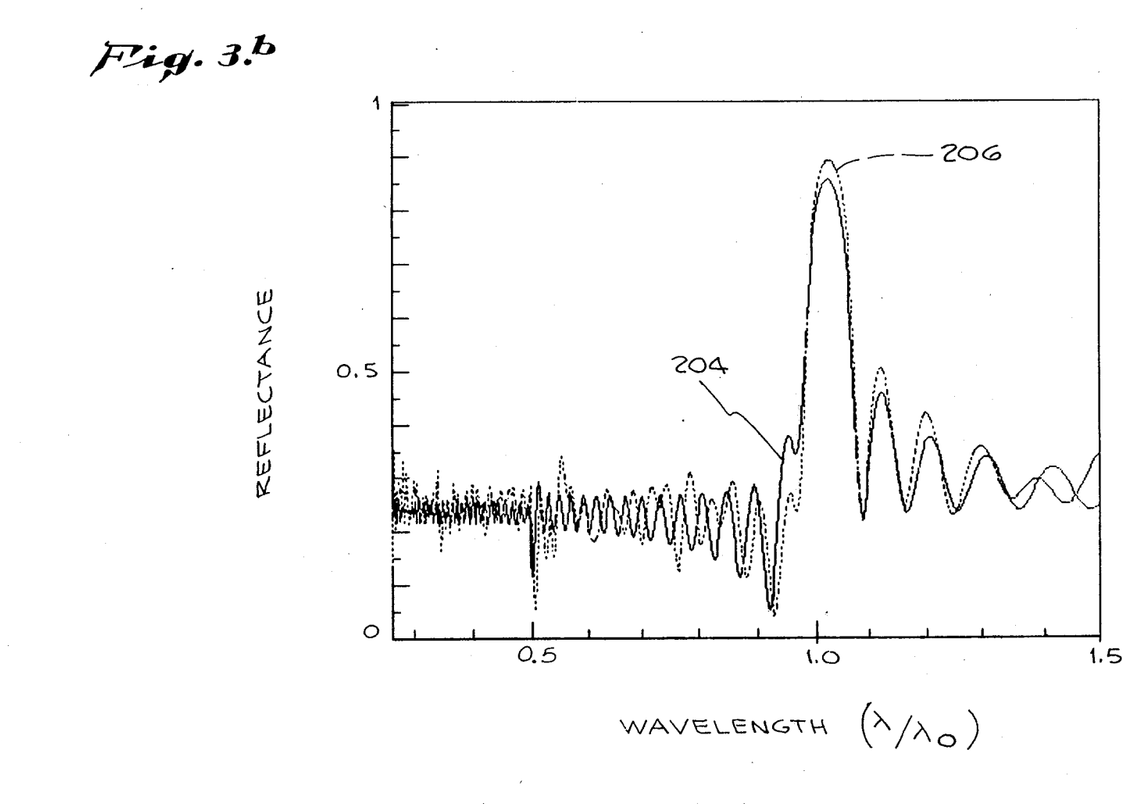
Figure 3A:
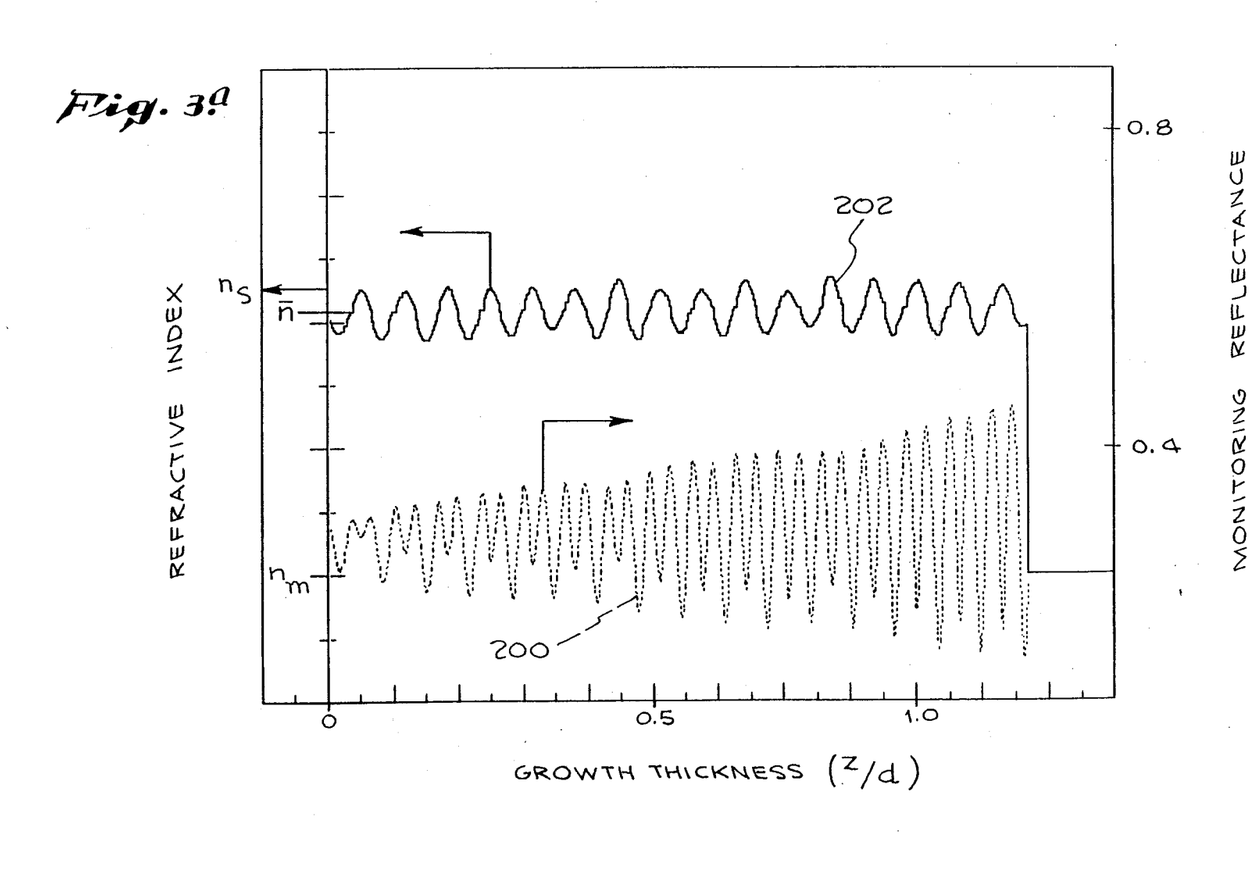
Figure 4D:
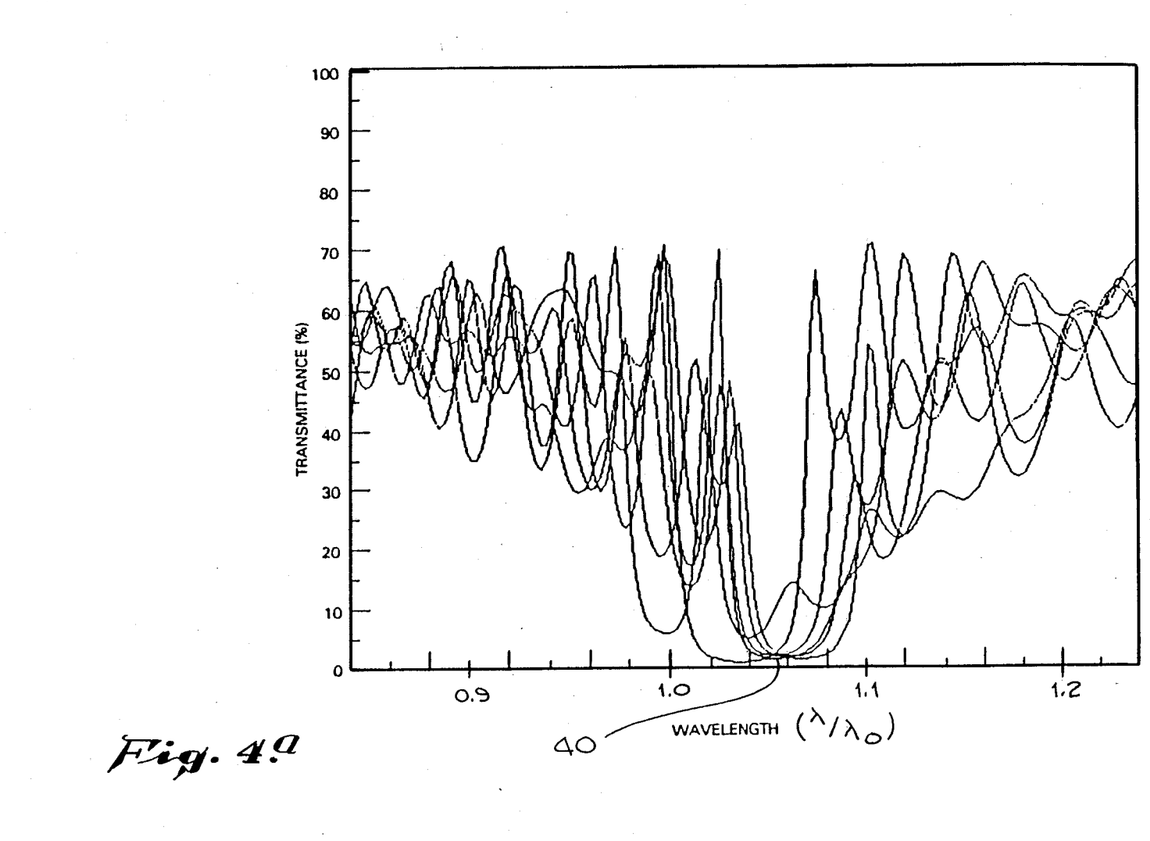

In a similar but more complex manner the algorithm of FIG. 5 can accurately manage random errors, non-fixed systematic error, and combinations of any random and systematic errors that can typically occur in an otherwise fairly controlled rugate deposition process as shown by the results in FIGS. 3 and 4.

More accuracy is of course obtained by monitoring for more corrective opportunities such as can be obtained with lower wavelength beam monitoring. Alternatively monitoring can be accomplished with scanning monochromator techniques via the figure of merit method which results in film thickness increments that correspond to non quarter-wave optical thicknesses shorter than quarter-wave.

This algorithm method of deposition with error-compensation control can be applied to any process which blindly produces a continuously varying refractive index in sinusoidally modulated manner. This algorithm accomplishes this result by providing corrective process commands to insure sufficient maintenance of the Bragg condition throughout the thin film rugate deposition.

Obvious and simple improvements can be incorporated within the framework of the algorithm in FIG. 5. For example, fixed or nearly fixed systematic errors would result in algorithmic corrections that are nearly identical but continually persistent over many sinusoidal periods of rugate deposition. Obvious process adjustments could be made to minimize such fixed or nearly fixed systematic errors in order to achieve a commanded profile that approaches the ideal target.

An application of the process control algorithm method of the present invention is shown by the chemical processing block diagram of FIG. 7. The process deposition source 158 comprises, for example, two process gases (hydrogen and arsine) and one purge gas (argon) which are input through separate lines (not shown) to a metal-organic chemical vapor deposition system (generally indicated at 76) for growth of an epitaxial film of a selected material, such as $Al_xGa_{1-x}As$, to form an optical medium 14 of FIG. 1. The gases are supplied from compressed gas cylinders and, in a preferred embodiment of the present invention, the opening and closing of the valves and the flow of the gases in the system are controlled by process computer control 68. Optionally, this control may be performed manually. The inflowing arsine is used as the arsenic source and is delivered at flow rates resulting in an excess of arsine at the deposition substrate or sample 10. The mass flow controllers bubble precise amounts of hydrogen through the liquid phase metal-organics, trimethyl aluminum (TMA) and trimethyl gallium (TMG), and the metal organics are contained in bubbler cylinders, each surrounded by a temperature controlled bath. Each metal organic vapor flow rate is determined by its temperature bath for vapor pressure control and by its $H_2$ bubbler carrier flow. The vapors are then inlet further into the system to the reactor chamber 76 where the sample substrate 10 is heated to an appropriate reaction temperature to decompose the metal-organic compounds and allow the reaction thereof with arsine to form an epitaxial aluminum-gallium-arsenide film at atmospheric pressure. One such system incorporates a cylindrical quartz reactor tube that accommodates a heated two-inch diameter substrate facing down against the flow of process gas. A high-purity boron-nitride pedestal holds the wafer in place under a graphite susceptor that is inductively heated. This design permits heated exhaust gas to be removed buoyantly above and away from the reaction zone and eliminates particulates formed on the chamber walls from falling onto the substrate. Furthermore, the weight of the graphite susceptor insures intimate contact for uniform and reproducible heating of the substrate. During the growth process, a water-cooled jacket minimizes the out-gassing of impurities from the quartz tube.

Each metal-organic reactant (TMA and TMG) and the reaction chamber has its own bypass loop to ensure that stable flow and the desired initial rate are established before exposure to the substrate surface. Stoichiometry of the film depends on previously calibrated gas flow rates and relative partial pressures of the constituent precursors. The exhaust gases are pushed through an exhaust manifold for disposal in a safe manner. The reactor chamber 76 area may be cross-flushed with laminar air flow to maintain cleanliness during substrate loading or removal.

FIG. 7 also represents a generalized optical monitoring scheme useful in practicing the present invention required to obtain optical thickness increments. More advanced methods, as well as the simple turning value method, including the figure of merit method, which involves wavelength scanning techniques, may be used. Light is filtered through a scannable monochromator, either at the monitor beam source 166 or at the detector 162 which sets the monitor wavelength, $\lambda_m$. The sample 10 is held within the chamber 76, and light from monitor beam source 166 is reflected from mirror 126 onto the sample 10, and then from the sample 10, onto the mirror 128, for output to the external control system beyond the reactor chamber 76. Alternatively, witness samples receiving partial filter deposition may be moved into place to monitor the deposition process. The reflected monitor beam detector 162 receives the light from the sample 10, and converts the optical input signal from the sample 10 and mirror 128, and electronically processes the optical signal to determine optical thickness increments with the signal processor 164. The optical thickness signal processor provides data to the computer control 68 where the algorithm controls the process. Optionally, transmitted beam detector 161 and signal processor 163 may be used with the system of FIG. 7. The computer 68 operates in accordance with the process phase control algorithm shown in FIG. 6.

FIG. 7 also generically represents any deposition process capable of blindly producing thin films with a continuously varying refractive index in a sinusoidally modulated fashion. For example, thermal evaporation, electron beam evaporation, photochemical vapor deposition, sputter deposition, laser-assisted deposition, etc., and combinations of these techniques, can benefit from optical monitoring and algorithm control in accordance with the present invention.

While a particular example or set of examples has been demonstrated for carrying out the process of the present invention, alternative variations of the process, as well as the appearance and final result of the rugate filter of this invention developed using the present process are well within the scope of the foregoing disclosure. Thus alternative embodiments of both the process and product of this invention are intended to be incorporated within the scope of the appended claims.

What is claimed is:

1. A method for forming a single notch rugate filter comprising a substrate having formed thereon a layer of an optical material having a refractive index that varies according to a predetermined sinusoidal pattern as a function of the thickness of said layer, comprising the steps of:

(a) providing said substrate;

(b) providing reactants which interact physically or chemically to form said optical material as a layer on said substrate;

(c) providing an ideal target profile of refractive index versus thickness of said layer, said profile having said sinusoidal pattern, and determining from said profile ideal values of optical thickness at successive points in time corresponding to points along said profile;

(d) providing target process conditions as a function of time for said reactants operative to form said layer having said ideal target profile;

(e) initiating said process conditions to form a layer having a depositing profile;

(f) performing continuous optical monitoring of said layer as deposited to provide an optical signal;

(g) determining from said optical signal the measured increments of optical thickness of said layer as deposited and continuously monitoring said increments of optical thickness;

(h) determining whether said optical thickness value is measured at the predetermined time relative to said target process conditions that produce said ideal target profile;

(i) based on the results of (h), determining the sinusoidal phase angle adjustment required to be made to the depositing profile of refractive index versus thickness of said layer in order to follow accurately said ideal target profile;

(j) altering said process conditions over time to provide said sinusoidal phase angle adjustment to said actual profile;

(k) repeating steps "f" through "j" the number of times required to form said single notch rugate filter.

2. The method of claim 1 wherein:

(a) said optical thickness value in step "h" is measured after said predetermined time; and (b) said sinusoidal phase angle adjustment in step "i" produces a continuous horizontal segment adjustment to said depositing profile.

3. The method of claim 1 wherein:

(a) said optical thickness value in step "h" is measured before said predetermined time; and (b) said sinusoidal phase angle adjustment in step "i" produces a vertical segment adjustment to said depositing profile 4. The method of claim 1 wherein:

(a) said optical thickness signal in step "h" is received at said predetermined time; and (b) said sinusoidal phase angle adjustment is zero.

5. The method of claim 1 wherein steps "h" through "j" are under computer control.

6. The method of claim 1 wherein said optical monitoring of step "f" comprises directing an optical monitoring light beam at said layer as deposited so that said light beam is reflected off or transmitted through said layer at normal or near normal incidence into an optical detector means, wherein said detector means generates said optical signal which is a function of said light beam directed into said detector.

7. The method of claim 1 wherein said reactants comprise metal-organic materials.

8. The method of claim 7 wherein said reactants comprise trimethyl aluminum, trimethyl gallium, and arsine and said layer comprises epitaxial aluminum gallium arsenide.

9. The method of claim 1 wherein said determining of said sinusoidal phase angle adjustment required comprises applying the following equation:

$$n(z) = n^* - \frac{\Delta n^*}{2} \sin\left(\frac{4\pi n^* z^*}{\lambda_o} + \phi\right)$$

where
  n = refractive index of optical material
  z = layer thickness
  $\underline{n}$(z) = refractive index as a function of layer thickness
  $\overline{n}$ = average index of refraction over one period in film thickness space (z)
  $\lambda_o$ = notch wavelength (desired)
  * = parameters that can have local errors, which are compensated for by $\phi$
  $\phi$ = sinusoidal phase angle adjustment to insure Bragg reflection at $\lambda_o$.

10. A single notch rugate filter formed by the method of claim 1 wherein said filter produces a reflection at a single, narrow band of wavelengths and said reflection follows Bragg's law.

* * * * *